United States Patent
Onoshiro et al.

(10) Patent No.: US 6,887,330 B2
(45) Date of Patent: May 3, 2005

(54) MACHINE FOR PUNCHING OUT ELECTRONIC CIRCUITRY PARTS, METHOD FOR REPLACING TAPE SUPPLY REELS, AND METHOD FOR PRODUCING ELECTRONIC CIRCUITRY PARTS FROM TAPE

(75) Inventors: Jun Onoshiro, Tokyo (JP); Kenya Wada, Tokyo (JP); Hideaki Kataho, Tokyo (JP)

(73) Assignee: Hitachi High-Tech Electronics Engineering Co., Ltd., Tokyo (JP)

(*) Notice: Subject to any disclaimer, the term of this patent is extended or adjusted under 35 U.S.C. 154(b) by 0 days.

(21) Appl. No.: 10/613,008

(22) Filed: Jul. 7, 2003

(65) Prior Publication Data

US 2004/0069112 A1 Apr. 15, 2004

(30) Foreign Application Priority Data

Jul. 9, 2002 (JP) ........................................ 2002-200090

(51) Int. Cl.[7] .............................................. B65H 21/00
(52) U.S. Cl. ........................ 156/159; 156/502; 156/504; 242/554.1
(58) Field of Search ................................. 156/157, 159, 156/502, 504, 505, 304.1, 304.3; 242/551, 552, 554.1

(56) References Cited

U.S. PATENT DOCUMENTS

| 2,536,153 A | * | 1/1951 | Bishop | 242/554.1 |
| 4,432,481 A | * | 2/1984 | Miller | 226/9 |
| 4,555,281 A | * | 11/1985 | Mattei et al. | 156/64 |
| 5,643,395 A | * | 7/1997 | Hinton | 156/361 |
| 6,073,334 A | * | 6/2000 | Asai et al. | 29/513 |
| 6,157,870 A | * | 12/2000 | Gfeller et al. | 700/231 |
| 6,237,217 B1 | * | 5/2001 | Bohn et al. | 29/806 |
| 2002/0189764 A1 | * | 12/2002 | Keene et al. | 156/353 |

FOREIGN PATENT DOCUMENTS

EP 790205 A2 * 8/1997

* cited by examiner

*Primary Examiner*—Mark A. Osele
(74) *Attorney, Agent, or Firm*—Antonelli, Terry, Stout & Kraus, LLP (57) ABSTRACT

Carrier tapes, each carrying electronic circuitry parts at predetermined intervals on a carrier portion, are successively and continuously fed to a punching station from a tape feeding station with at least a pair of tape supply reels. While a carrier tape from a first supply reel is being fed to the punching station, a carrier tape from a second supply reel is set in a standby position. As soon as the carrier tape from the first supply reel is consumed to a last electronic part, a head end of the carrier tape from the second supply reel is spliced to a tail end of the carrier tape of the first supply reel by means of tape holder members located in the course of a tape supply route between the tape feeding station and the tape punching station, thereby make replacement of the tape supply reel quicker and easier.

8 Claims, 10 Drawing Sheets

MACHINE FOR PUNCHING OUT ELECTRONIC CIRCUITRY PARTS, METHOD FOR REPLACING TAPE SUPPLY REELS, AND METHOD FOR PRODUCING ELECTRONIC CIRCUITRY PARTS FROM TAPE

BACKGROUND OF THE INVENTION

1. Field of the Art

This invention relates to a machine for punching out assembled electronic circuitry parts from a carrier tape which carries a large number of assembled electronic circuitry parts or devices like TCP (Tape Carrier Packages) in a predetermined pitch along its length, a method for replacing carrier tape supply reels, and a method for producing assembled electronic circuitry parts or devices from a carrier tape.

2. Prior Art

In mounting an electronic parts or component on a circuit board, especially in mounting an electronic part like an IC (integrated circuit) device on a circuit board, it has been the general practice to mount an IC device directly on a wiring circuit board as in the case of so-called direct mounting system or to mount on a wiring board an IC device which has been assembled on a substrate film with a wiring pattern. In the latter case, electronic circuitry parts are assembled on a tape in a predetermined pitch in the longitudinal direction of the tape, and the electronic parts are punched out from the carrier tape one after another and mounted on a wiring board.

For instance, in mounting driver electronics parts on a glass substrate of a liquid crystal display panel, it has been widely known in the art to bond an ACF (Anisotropic Conductive Film) on lead portions of electrodes on the glass substrate of the liquid crystal display panel and then bond a substrate film of an electronic part on the ACF by application of heat and pressure. The ACF tape has conductive particles dispersed in a binder resin, so that, by application of heat and pressure, the binder resin is hardened to connect the wiring pattern on the substrate film electrically with the electrodes on the side of the glass substrate. This type of mounting is called, for example, TAB (Tape Automated Bonding) or COF (Chip On Film). A large number of electronic parts which are arrayed on a tape are cut or punched one after another from the tape immediately before they are mounted on a glass substrate, picking up and mounting each electronic part on the glass substrate by the use of a vacuum-operated handling means.

Therefore, the electronic parts punching machine is largely constituted by a tape feeding station, a tape punching station and a tape recovery or collecting station. Set in an operative position at the tape feeding station is a tape supply reel which is loaded with a roll of carrier tape having an electronic circuitry part carrier portion. Tape feed means are provided a tape travel route from the tape feeding station to the tape punching station and to the tape collecting station, and the carrier tape from the supply reel is fed pitch by pitch by the tape feed means to send the electronic parts carrier portions forward one after another. As soon as the tape is fed by one pitch, a punching means with a cutter unit is actuated to punch out and separate one electronic circuitry part from the tape. The punched electronic part is mounted on a glass substrate by means of a handling means.

Since there is a tape travel path of a certain length between the tape feeding station and the tape punching station, front and rear leader tapes of a length which at least corresponds to the length of that tape travel path are usually attached to the front and rear ends of an electronic parts carrier portion of the tape, respectively. The front and rear leader tapes contain no electronic parts. Accordingly, upon setting a tape supply reel at the tape feeding station, initially the front leader tape has to be fed forward as far as a position past the tape punching station, by an idle feed. In this connection, in a case where tape feed means are provided upstream and downstream sides of the tape punching station, the fore end of the front leader tape is drawn out at least to a position forward of the tape punching station in the tape feed direction and brought into engagement with the tape feed means. The supply of the carrier tape from the supply reel comes to an end when the last one of the electronic circuitry parts is punched out from the tape at the tape punching station. At the instant when the last electronic part is punched out, the rear end of the carrier tape is still supported on the supply reel by way of the rear leader tape which is connected to the rear end of the electronic part carrier portion of the tape.

In order to permit an interrupted punching operations at the tape punching station even after punching out the last electronic part on one tape, it has been the general practice to replace the tape supply reel currently used at the tape feeding station by a fresh tape supply reel, in the manner as follows.

In the first place, as soon as the last electronic circuitry part on the tape from the first supply reel is punched out at the tape punching station, the tape is fed forward until the tail end of its rear leader tape is displaced to a position forward of the tape punching station. Then, a fresh supply reel is set at the tape feeding station to replace the empty or consumed supply reel, and a front leader tape of the fresh reel is drawn out to a predetermined position along the tape travel path. In the next place, the fresh tape is fed forward to advance a foremost electronic circuitry part on the carrier portion of the tape to a punching position.

In this instance, the replacements of tape supply reels have thus far depended on manual labor of an operator although it is very troublesome and time consuming. In addition, while a consumed tape supply reel is being replace, despite great time losses, it has been necessitated to suspend an operation of mounting electronic circuitry parts on a glass substrate. Furthermore, the operator is required to pay careful attention to the progress of the tape punching operation in order to replace the supply reel in a best timing to avoid large time losses, i.e., to replace the supply reel as soon as the last electronic circuitry part of the currently operating supply reel is punched out at the tape punching station. This means that, in order to suppress the time loss to a minimum, the operator is required to stand by the machine well before the time point when the last electronic circuitry part advances to the punching station. The operational efficiency is deteriorated considerably by the reel replacements because the operator cannot do other jobs during each standby period.

Especially, as a result of recent progresses and improvements in automatic mounting apparatus for electronic circuitry parts, there has been a trend toward speeding up the tact time of electronic parts mounting operations, consuming the tape of each supply reel in a shortened period of time and as a result necessitating to replace the supply reel at a higher frequency. It is a paramount requisite to shorten the time period of the reel replacements in order to shorten the mounting electronic parts mounting time.

SUMMARY OF THE INVENTION

In view of the foregoing situations, it is an object of the present invention to provide a machine for punching out assembled electronics circuitry parts from a carrier tape, which makes replacements of tape supply reels quicker and easier, without requiring an operator to replace a tape supply reel in a particular timing, that is to say, without restrict the reel replacing timing to a time point when a currently used tape has been consumed to a last electronics circuitry part.

It is another object of the present invention to provide a punching machine as mentioned above, which can carry out a punching operation electronics continuously from one tape to another, without restricted by the length of the carrier tape which is wound on each supply reel.

It is still another object of the present invention to provide a punching machine as mentioned above, employing a tape switcher which permits quick replacements of tape supply reels and which makes it possible to carry out a punching operation in an efficient manner by shortcutting leader tape portions of carrier tapes.

According to the present invention, in order to achieve the above-stated objectives, there is provided a machine for punching out assembled electronic parts from a carrier tape, including a tape feeding station arranged to reel off an electronic parts carrier tape having a plural number of assembled electronic part sections formed in a predetermined pitch in the longitudinal direction thereof, and a tape punching station arranged to punch out the electronic part sections successively from the tape,
characterized in that the machine comprises: at least a couple of reel support shafts provided separately at the tape feeding station; and a tape switcher provided in association with a tape travel route from the tape feeding station to the tape punching station and adapted to releasably hold a fore end portion of a carrier tape from a tape supply reel in a standby position while a carrier tape is being fed to the tape punching station from a currently active tape supply reel, and to splice the fore end of the carrier tape from the standby reel to the carrier tape from the currently active supply reel at a position posterior to a last electronic part section on the carrier tape from the currently active reel, switching the tape supply from the currently operating reel to the standby reel substantially in an uninterrupted manner as soon as the carrier tape from the currently operating reel has been consumed to the last electronic part section.

In short, with the above arrangements according to the present invention, after starting to reel off a carrier tape from one supply reel, another supply reel can be set in a standby position at any time before the carrier tape from one supply reel is consumed completely. Accordingly, it becomes unnecessary for the operator to stand by for a long time at the time of replacing the tape supply reels, and operational time losses as caused by reel replacements can be reduced to a marked degree. Preferably, a tape end detection means is located in the course of the tape travel route from the tape feeding station to the tape punching station thereby to detect a position of the last electronic part section on the carrier tape from the currently operating reel. On the basis of a signal from the tape end detection means, the tape switcher is actuated the tape supply from one reel to the other. In a preferred form of the present invention, the carrier tape has front and rear leader tapes attached to the fore and rear ends of the electronic parts carrier portion, and the tape switcher includes a cutter means for cutting a rear leader tape portion of the carrier tape from the currently operating supply reel, a tape holder means for holding a rear end portion of the tape cut by the cutter means and overlapping same on a fore end portion of the carrier tape from the standby reel, and stapler means for connecting the overlapped rear and fore end portions securely to each other. A rear end portion of the consumed tape is cut off at the splicing position, and a major part of the front leader tape portion of the fresh tape can be cut off to shorten the length of a blank tape portion which would necessitate an idle tape feed, for enhancing the operational efficiency of the machine all the more.

According to the present invention, there is also provided a method for replacing a consumed reel by a fresh tape supply reel in punching out assembled electronic parts from a carrier tape by a machine including a tape feeding station arranged to reel off an electronic parts carrier tape having a plural number of assembled electronics circuitry part sections formed in a predetermined pitch in the longitudinal direction thereof, and a tape punching station arranged to punch out the electronic part sections successively from the tape, the method comprising the steps of: setting a fresh tape supply reel at the tape feeding station while a carrier tape is being supplied to the tape punching station from a first tape supply reel, and connecting a fore end portion of the tape from the fresh supply reel to a tape switcher; and upon detecting that the tape from the first supply reel has been consumed completely, splicing the fore end portion of the tape from the fresh supply reel to a rear end portion of the consumed tape while cutting off the rear end portion of the consumed tape from the first supply reel.

Further, according to the present invention, there is provided a method for fabricating electronics circuitry part units each having an IC device mounted on a wiring pattern formed a substrate film by a machine having a tape feeding station arranged to reel off an electronic parts carrier tape having a plural number of assembled electronic part sections formed in a predetermined pitch in the longitudinal direction thereof, and a tape punching station arranged to punch out the electronic part sections successively from the tape, the method comprising the steps of: setting a couple of supply reels of the electronic parts carrier tape separately on two reel support shafts; while feeding a carrier tape from one supply reel pitch by pitch toward the tape punching station, detecting electronic parts on the carrier tape one after another by a sensor means, setting the detected electronic parts one after another in a punching position at the tape punching station, punching out and separating the electronic parts one after another from the carrier tape by actuating a cutter provided at the tape punching station; upon detecting by a sensor means that all of the electronic parts on the carrier tape from the one supply reel have been consumed completely, splicing a fore end portion of a carrier tape from the other supply reel to a rear end portion of the carrier tape from the one supply reel at a position posterior to a last electronic part section of the consumed tape, cutting the tape from one supply reel at a splicing position, starting a punching operation on the carrier tape from the other supply reel as soon as a foremost electronic part section is advanced to the tape punching station; and while the punching operation on the carrier tape from the the other supply reel is in progress at the tape punching station, removing the consumed reel and setting a fresh supply reel in position in place of the consumed reel.

The above and other objects, features and advantages of the present invention will become apparent from the follow particular description, taken in conjunction with the accompanying drawings which show by way of example some preferred embodiments of the invention. Needless to say, the present invention is not limited to the particular forms which are shown in the accompanying drawings only for illustrative purposes.

DESCRIPTION OF PREFERRED EMBODIMENTS

Figure 1:
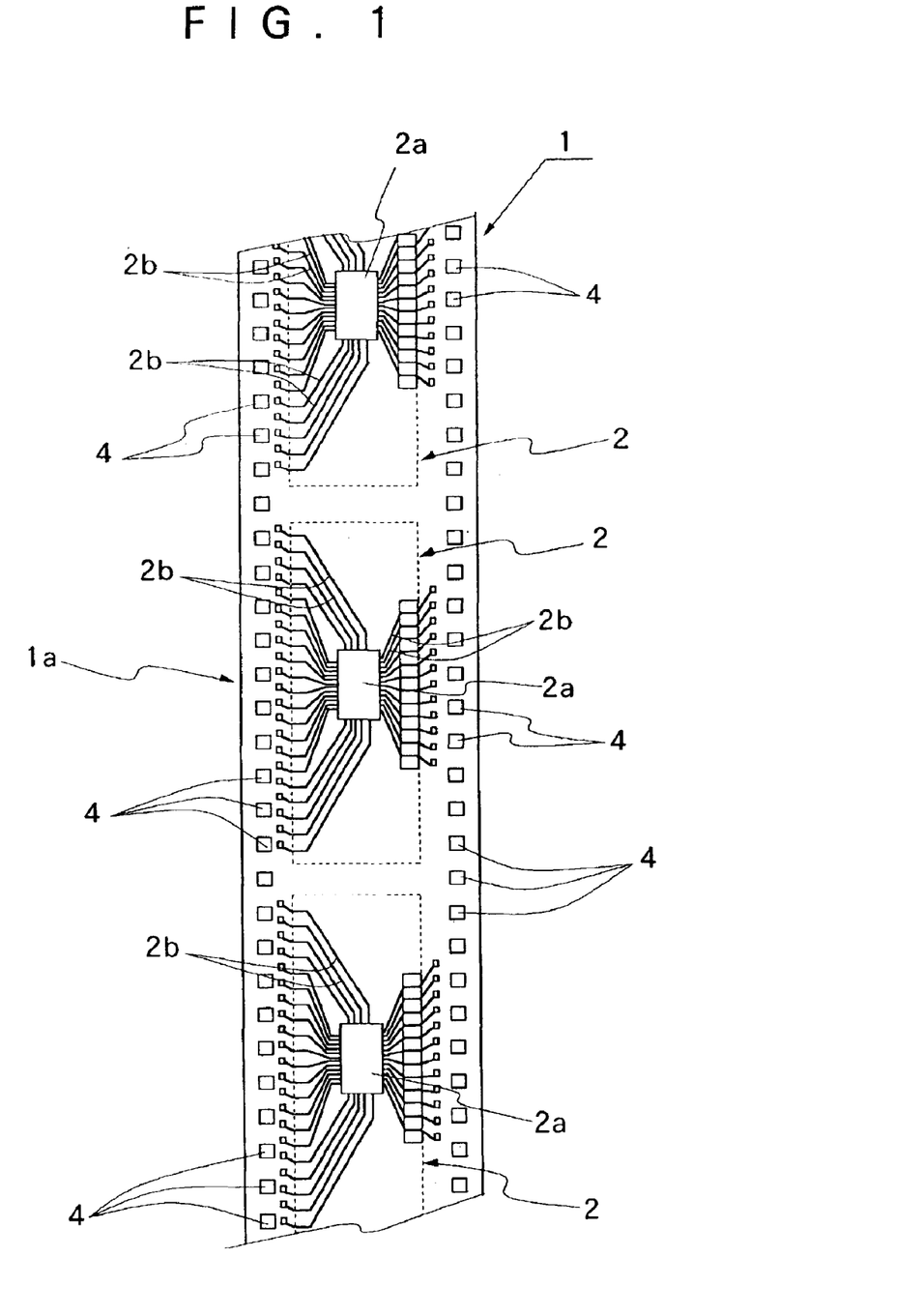
FIG. 1 is a schematic view of a electronic parts carrier portion of a tape employed in an embodiment of the present invention.
Figure 2:
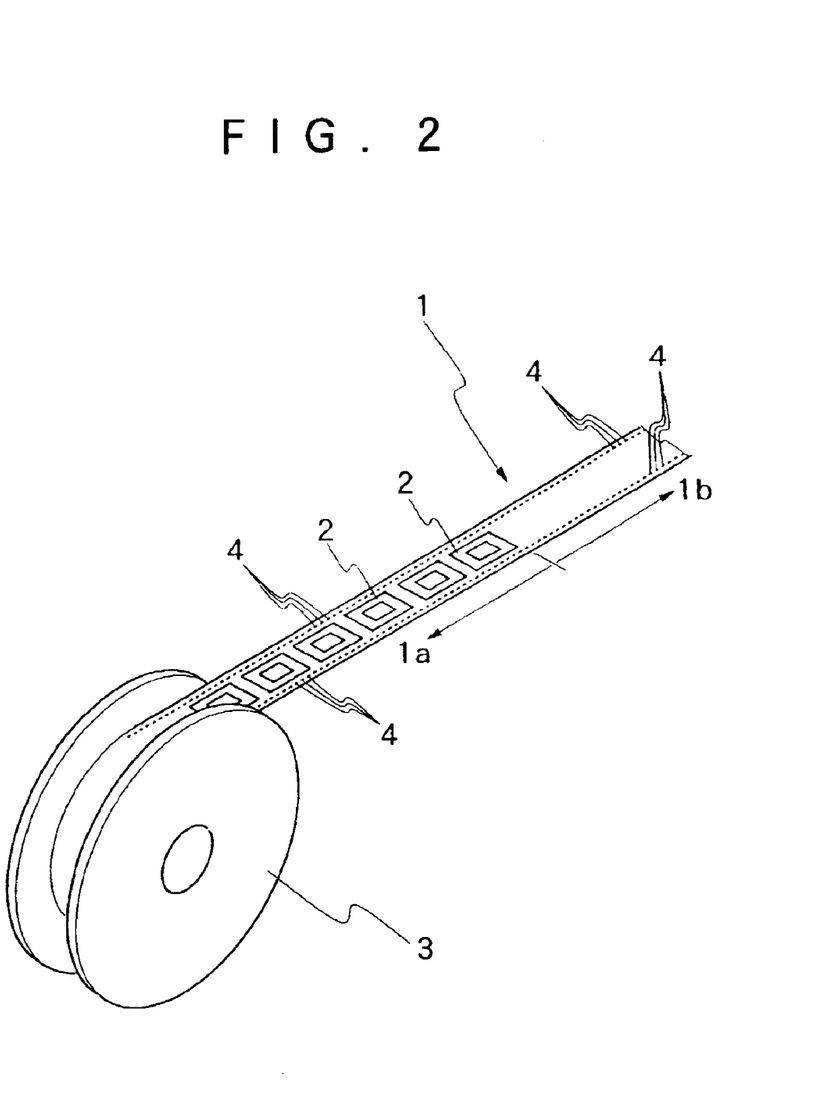
FIG. 2 is a perspective view of the tape wound on a supply reel.

Hereafter, the present invention is described more particularly by way of its preferred embodiments with reference to the accompanying drawings. Firstly, shown schematically in FIG. 1 is an example of carrier tape construction. The tape 1 is provided with an electronic circuitry part carrier portion 1a having a large number of electronic circuitry parts sections 2 successively formed thereon in a predetermined pitch in the longitudinal direction. In each one of the electronic part sections 2, an electronic part 2a is mounted on a wiring film and connected to a wiring pattern 2b which is formed on the film by printing or by other suitable means. The assembled electronic circuitry part 2a is separated from the tape 1 by punching out the part section along a cutting line which is indicated by broken line. As shown in FIG. 2, the tape 1 is wound on a reel 3 and reeled off as it is supplied in the forward direction along a tape supply route or tape travel path. In this instance, for the purpose of protecting the electronic circuitry parts 2, the tape 1 is wound on the reel 3 along with a separator tape which will be described hereinlater.

A large number of sprocket holes 4 are perforated in a predetermined pitch along right and left side edges of the tape 1 for engagement with claws of a drive sprocket. As a drive sprocket is rotationally driven in a predetermined direction, the tape 1 is fed forward along a path of travel either continuously or pitch by pitch. Attached to the front and rear ends of electronic parts carrier portion 1a of the tape 1 are front and rear leader tape portions 1b and 1c, respectively. Seen in FIG. 2 is the front leader tape portion 1b which is attached to the fore end of the electronic parts carrier portion 1a of the tape 1. On the other hand, the rear leader tape portion 1c which is wound on a core of the supply reel 3 is not seen in that figure. Sprocket holes are provided in the leader tape portions 1b and 1c continuously to or from the electronic parts carrier portion 1a, but no electronic circuitry parts exist on these front are rear leader tape portions 1b and 1c.

Figure 3:
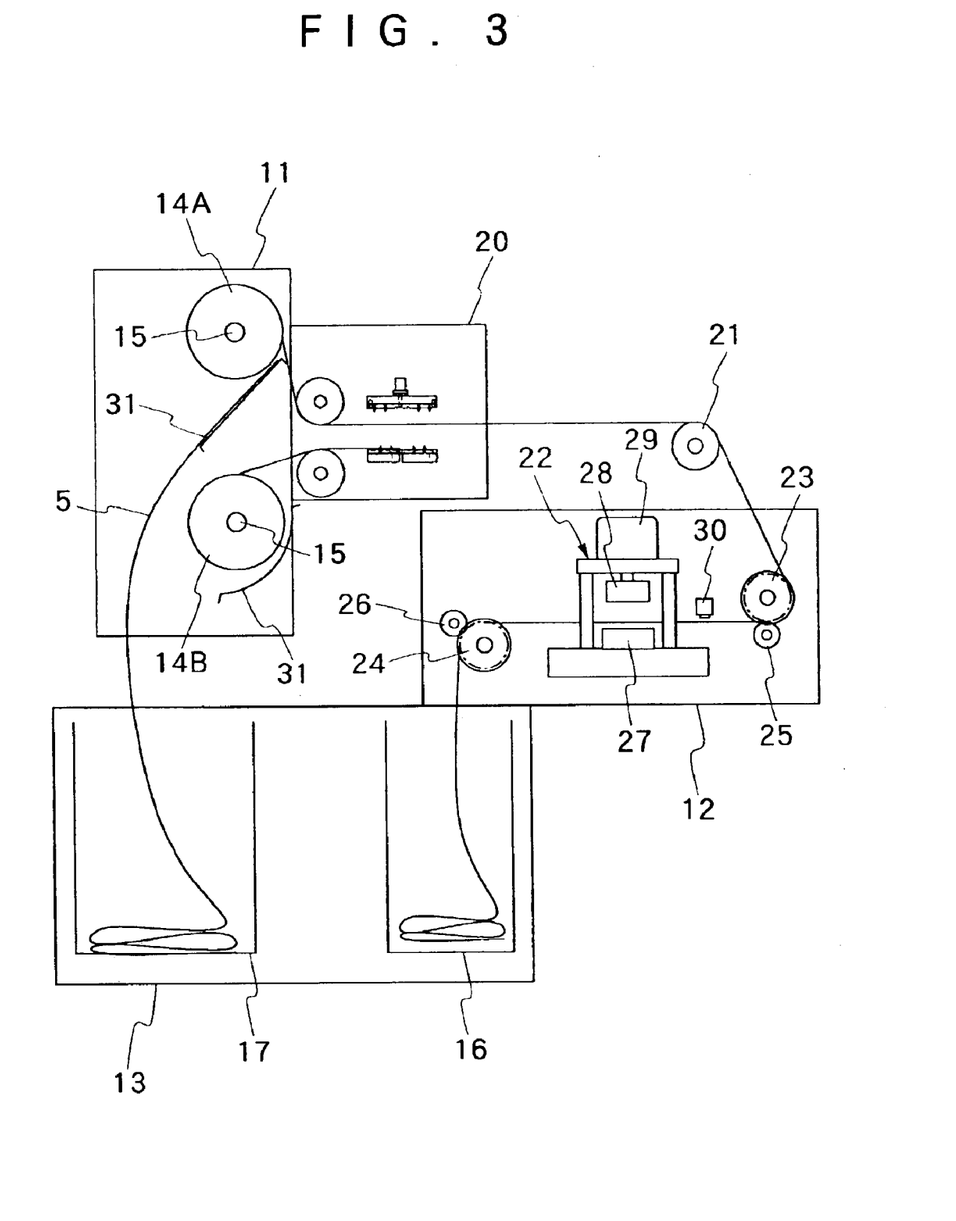
FIG. 3 is a schematic illustration showing an example of a tape punching machine.

Shown schematically in FIG. 3 is the construction of a machine for punching out electronic circuitry parts from the tape 1. In this figure, indicated at 11 is a tape feeding station, at 12 a tape punching station, and at 13 a tape recovering or collecting station. Reel support shafts 15 are provided at the tape feeding station 11 to support tape supply reels 14. A carrier tape 1 is wound on each tape supply reel 14 in overlapped relation with a separator tape 5. Further, collection boxes 16 and 17 are provided at the collecting station 13 to collect punched tape and separator tape 5.

In this instance, as clear from FIG. 3, the tape feeding station 11 is arranged to support a couple of tape supply reels 14 (which are labeled with reference numerals 14A and 14B, respectively, to distinguish them from each other). Therefore, a couple of reel support shafts 15 are provided separately at the tape feeding station 11. One of the two tape supply reels 14 (the supply reel 14A in the case of FIG. 3) is in use, while the other one (the supply reel 14B in the case of FIG. 3) remains in a standby position. As soon as the feed tape 1 of the supply reel 14A is consumed to the last electronic circuitry part, the carrier tape 1 of the supply reel 14B in a standby position is automatically drawn out and quickly spliced to a rear end portion of the consumed tape to permit an uninterrupted continuous punching operation. Accordingly, it becomes possible to shorten the time of reel replacements and to make it unnecessary for the operator to stand by well before a time point when a punching operation on one tape is ended. For this purpose, the punching machine is arranged to automatically detect an end of punching operation on one tape 1 and to switch the tape supply from one supply reel to the other which has been retained in a standby position to replace a consumed tape. Here, the expression that one tape 1 has been totally consumed means that all of the electronic circuitry parts on the electronic parts carrier portion 1a of that tape 1 have already been punched out at the tape punching station 12.

A tape switcher 20 is provided within the length of the tape travel path or tape supply route R from the tape feeding station 11 to the tape punching station 12 and at a position closer to the tape feeding station 11. The tapes from a couple of supply reels 14 are selectively supplied to a tape supply route R leading to the tape punching station 12 through the tape switcher 20. For this purpose, guide rollers 21 are provided at suitable positions along the supply route between the tape switcher 20 and the tape punching station 12 thereby to guide the tape 1.

Figure 4:
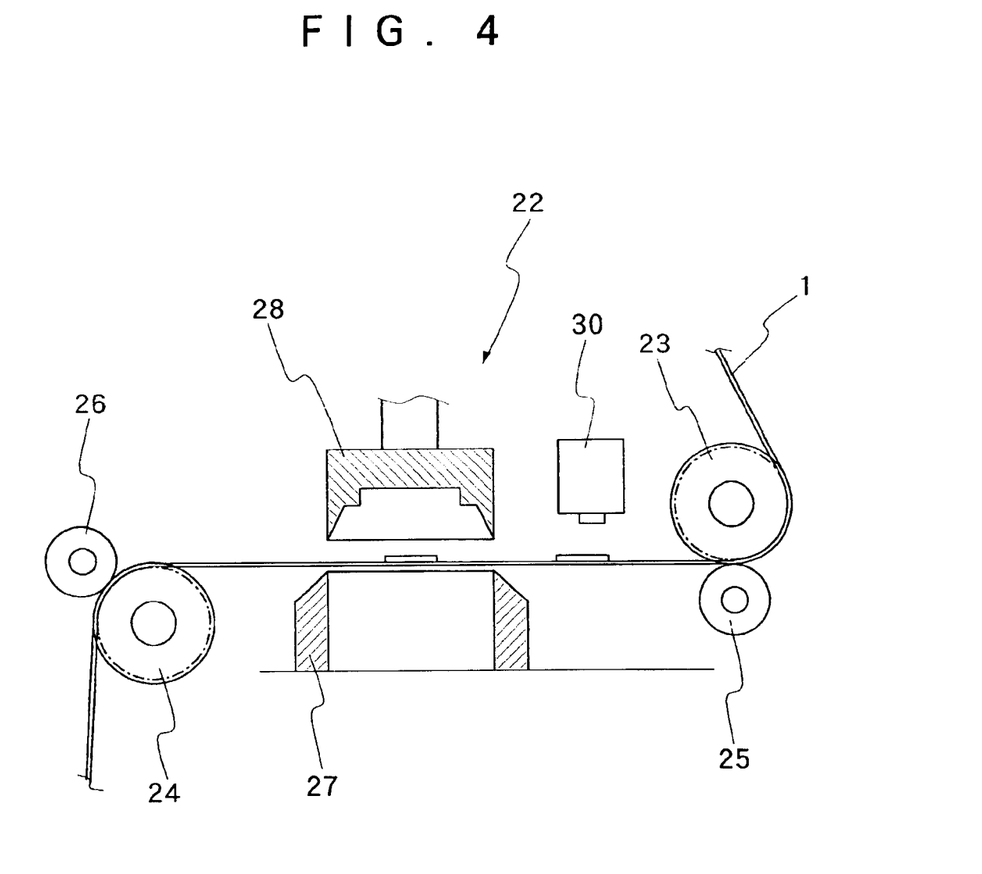
FIG. 4 is a schematic view of a tape punching station.

As shown also in FIG. 4, the tape punching station 12 is largely constituted by a cutter unit 22 and a feed means including feed-drive sprockets 23 and 24 which are located on the upstream and downstream sides of the cutter unit 22 for feeding the tape 1 pitch by pitch. Provided around the outer periphery of the sprockets 23 and 24 are claws to be engaged with the sprocket holes 3 in the tape 1. Further, the tape 1 is gripped by pinch rollers 25 and 26 which are abutted against the sprockets 23 and 24 to prevent the tape 1 from spontaneous floating movements of the tape 1 off the sprockets 23 and 24. Thus, the tape 1 is substantially maintained in a horizontal state between the two sprockets 23 and 24 and tensioned to a predetermined degree. As the two sprockets 23 and 24 are rotationally driven intermittently, the tape 1 is fed pitch by pitch in the forward direction.

The cutter unit 22 is constituted by a lower fixed blade 27 and an upper movable blade 28 which is driven up and down by a drive means 29 in the form of a solenoid or the like. Therefore, a cut is made into the tape 1 each time the movable blade 28 is driven downward to punch an electronic part section 2 out of the carrier portion of the tape 1. The operation of the cutter unit 22 is controlled on the basis of signals from a sensor 30 which is located in the tape supply route on the upstream side of the cutter unit 22 for detection of the electronic circuitry parts 2a.

After punching out all of the electronic part sections 2, the tape 1 is collected into a tape collection box 16 at the recovery station. In the meantime, the separator tape 5, overlapped on the tape I on the supply reel 14, is separated from the latter at a position on the upstream side of the tape switcher 20 and moved along a guide plate 31 to collect same in a collection box 17. In collecting the separator tape 5, if desired, the separator tape 5 may be once wound onto another reel which is provided separately from the supply reel 14, and rewound onto the supply reel 14 after the tape on that reel has been completely consumed.

The positions of the above-mentioned two supply reels at the feeding station as well as the tape supply routes from the two supply reels are not limited to the particular examples shown, and various layouts are possible in this regard. In the case of the layout shown in the drawing, one supply reels is located on the other supply reel. However, for example, they may be located at the same level and in laterally spaced relations with each other. However, the tape supply routes from the two supply reels 14 need to join at the position of the tape switcher 20. Punched and consumed tape and separator tape may be collected into the same collecting box if desired, or otherwise arrangements may be made to collect them onto a reel reels.

Now, let us assume that, as shown in FIG. 2, one supply reel 14, for example, the upper supply reel 14 in FIG. 2 is in use, and the tape 1 from the upper supply reel 14 is drawn out as far as the collecting station 13 via the tape punching station. In this state, the tape 1 is fed intermittently in step with the pitch of the electronic parts 2 to be cut off. The tape 1 is fed intermittently pitch by pitch by intermittently driving the sprockets 23 and 24 on the upstream and downstream sides of the cutter unit 22 at the tape punching station 12 from independent electric motors (or from a common electric motor).

More specifically, on the basis of a signals which is produced by the sensor 30, upon detection of an electronic circuitry part 2a on the tape 1, the tape 1 is fed forward by one pitch by the sprockets 23 and 24, and the movable blade 28 of the cutter unit 20 is lowered to cut an electronic part section 2 from the tape 1. The electronic circuitry part 2a which has been punched from the tape 1 is picked up, for example, by the use of a vacuum- or suction-type handling means. After cutting off and picking up an electronic circuitry part in the manner just described, the tape 1 is fed forward by one pitch again, followed by actuation of the cutter unit 20. Thus, the electronic part sections 2 are punched successively from the tape 1.

Then, as soon as the tape 1 from the supply reel 14A is consumed completely, that is to say, as soon as the last electronic part section 2 is punched out from the tape 1, tape supply is started this time from the supply reel 14B which is set on the other reel support shaft 15 of the feeding station 11. For this time, the second supply reel 14B is set on the second reel support shaft 15 at any time before the tape 1 of the first supply reel 14A is consumed to the last electronic part section 2. For switching the tape supply from the supply reel 14A to the supply reel 14B, the front leader tape portion 1b of the tape 1 from the supply reel 14B is spliced with the rear leader tape portion 1c of the tape 1 of the consumed supply reel 14A, cutting off the rear leader tape 1c on the side of the consumed supply reel 14A at along a splice line. As a consequence, the tape supply is switched from the supply reel 14A to 14B, that is to say, now the tape 1 from the fresh supply reel 14 is fed to the tape punching station 12.

Figure 5:
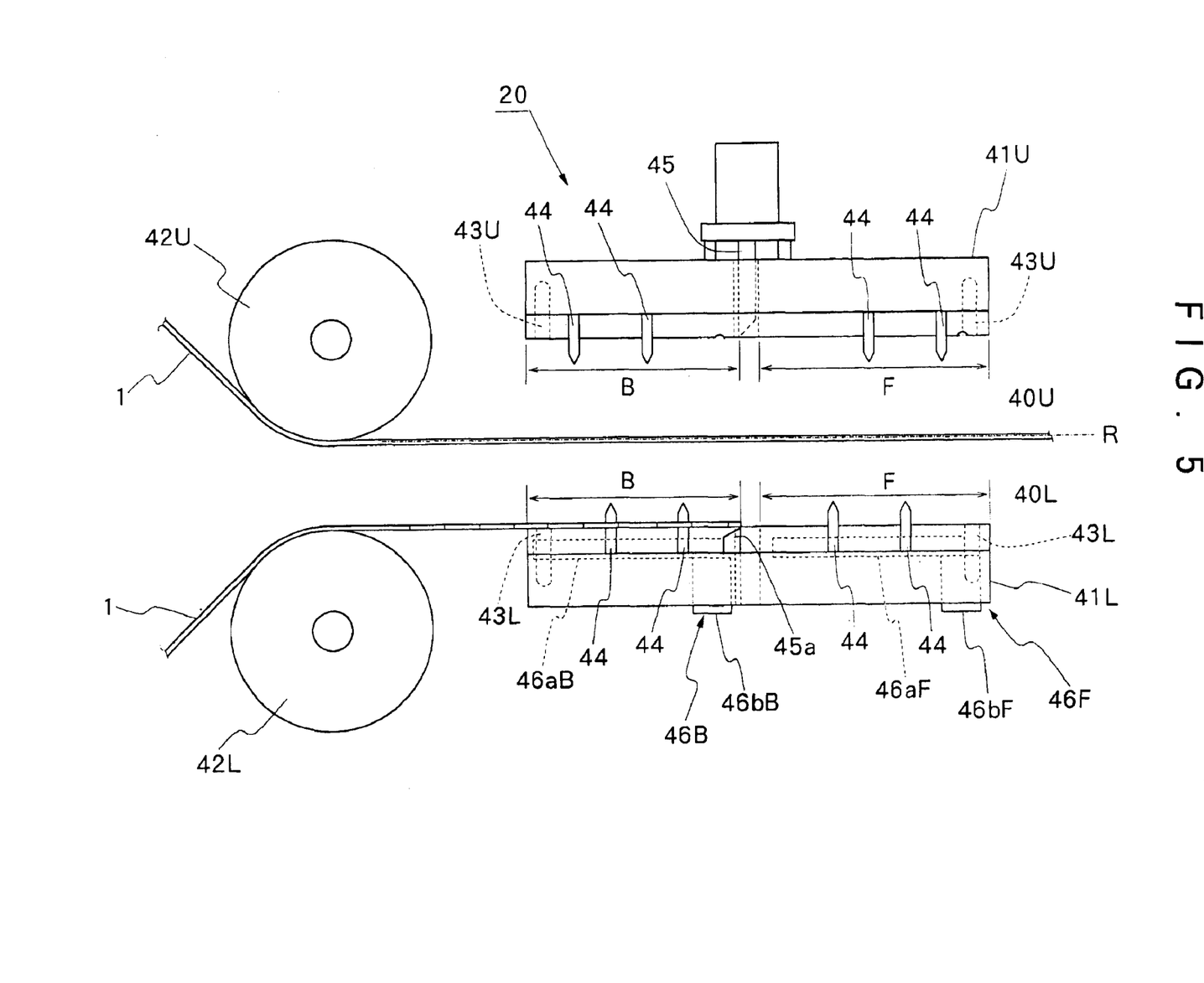
FIG. 5 is a schematic illustration of a tape switcher.

The tape cutting and splicing operations are formed automatically by the tape switcher 20. Now, one particular example of the tape switcher 20 is described on the basis of FIG. 5. In the case of FIG. 5, the upper supply reel 14A is currently in use while the lower supply reel 14B is set in position in a standby state.

The tape switcher 20 is largely constituted by an upper structure 40U and a lower structure 40L which are located on the upper and lower sides of a route of tape supply R, respectively. These upper and lower structures 40U and 40L of the tape switcher 20 include tape holder members 41U and 41L and rollers 42U and 42L, respectively. At least a couple of suction holes 43U are provided on the lower side of the tape holder members 4 thereby to grip and hold a leader tape portion of the tape 1 from the supply reel 14A. Similarly, at least a couple of suction holes 43L are provided on the upper side of the tape holder member 41U thereby to grip and hold a leader tape portion of the tape 1 from the supply reel 14B.

Both of the tape holder members 41U and 41L have a predetermined length in the direction of tape travel, and are each provided with a front holder zone F on the front side in the direction of tape travel for holding a rear end portion of a tape and a rear holder zone B on the back side in the direction of tape travel for holding a fore end portion of a tape. Planted on meeting side of the upper and lower tape holder members 41U and 41L are four positioning pins 44, i.e., a couple of positioning pins 44 in the front holder zone F and a couple of positioning pins in the rear holder zone B of each one of the upper and lower tape holder members 41U and 41L. These positioning pins 44 are adapted to protrude into the sprocket holes in the leader tape portion. Each one of the positioning pins 44 is tapered or narrowed down in its outer end portion to ensure smooth protrusion into a target sprocket hole 4. The interval between the positioning pins 44 in the front and rear holder zones F and B corresponds to the interval between the sprocket holes 4 as multiplied by an integer. Besides, the positioning pins 44 on the upper and lower tape holder members 41U and 41B are adapted to engage in sprocket holes 4 which are spaced from each other by one or a plural number of other sprocket holes 4.

Moreover, a cutter 45, including a cutter blade and a drive means, is provided on the upper tape holder member 41U at a position between the front and rear holder zones F and B. On the other hand, a passive cutter blade 45a is provided opposingly on the part of the lower tape holder member 41L. Furthermore, stapler mechanisms 46F and 46B are mounted in the front and rear holder zones F and B of the lower tape holder 41L, including needle supply magazines 46aF and 46aB and drive members 46bF and 46bB. These stapler mechanisms 46F and 46B serve as a tape splicing means for connecting a fore end of a fresh tape to a tail end of a consumed tape. This tape splicing means can employ different arrangements, for example, an arrangement using adhesive means or heat-pressure bonding means instead of staplers. Alternatively, in splicing two tapes, the stapler means may be used in combination with other fixation means if desired.

In FIG. 5, the upper and lower tape holder members 41U and 41L as well as the upper and lower rollers 42U and 42L, which are located on the upper and lower sides of the travel route R of the tape 1, are movable to shift their positions, between an operative position at the tape supply route R and a receded position away from the tape supply route R. In addition, the upper and lower tape holder members 41U and 41L are also movable back and forth to shift their positions in the direction of tape supply by a distance approximately corresponding to a half pitch in the longitudinal direction. Accordingly, when only the upper roller 42U is located in a position at the tape supply route R, the tape 1 from the upper reel 14A alone is supplied to and along the tape supply route R. On the other hand, when only the lower roller 42L is located at the tape supply route R, the tape 1 from the lower supply reel 14B alone is supplied to and along the tape supply route R. The upper and lower tape holder members 41U and 41L which are in confronting positions across the tape supply route R are joined together, and the cutter 45 is actuated to cut the tape 1 in the tape supply route R. Position of one of the upper and lower tape holder members 41U and 41L is shifted by a half pitch relative to the other holder member and the stapler 46F or 46B is actuated to splice a fresh tape 1 in a standby state to the tail end of a consumed tape 1.

The provision of the tape switcher 20 of the above-described arrangements makes it possible to automatically switch the supply of tape from one reel to the other to continue the punching operation, simply by setting a fresh supply reel on the reel support shafts 15 at any time point during a punching operation on the tape from the other supply reel. Besides, the supply of tape can be switched from one to the other supply reel promptly and smoothly.

Now, let's assume that electronic part sections 2 are being punched out from a tape 1 which is supplied from the first supply reel 14A as shown particularly in FIG. 3. In this case, the other or second supply reel 14B can be set on the reel support shaft 15 at any time point during a punching operation on the tape 1 from the first supply reel 14A and before the tape 1 from the first supply reel 14A is completely consumed. The fresh supply reel 14B is manually set on the reel support shaft 15 manually by an operator. If a consumed reel exists on the other reel support shaft 15 at the time of starting tape supply from the supply reel 14A, the consumed reel is removed from the reel supply shaft 15 and replaced by a fresh supply reel 14B. Then, the tape 1 is drawn out from the supply reel 14B and sprocket holes 4 in a fore end portion of the tape 1 are engaged with the positioning pins 44 in the zone B of the tape holder member 41L on the lower structure 40L of the tape switcher 20. At this time, the fore end portion of the tape 1 is gripped and retained in position by the suction holes 43L.

Figure 6:
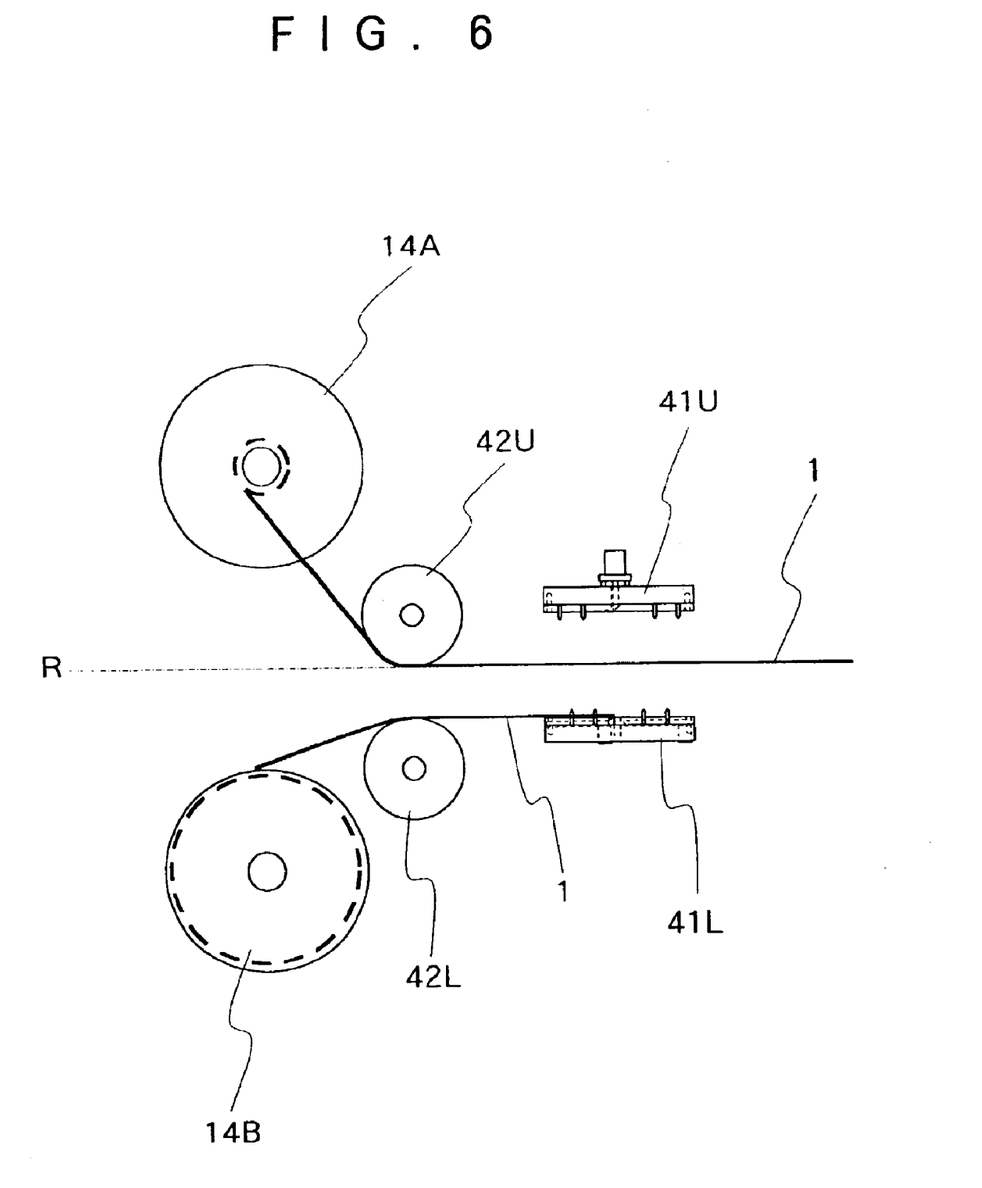
FIG. 6 is a schematic illustration of the tape switcher, in an operational phase where a tape from a currently operating supply reel has been consumed completely.

This state is illustrated in FIG. 6. In setting a fresh supply reel in a standby position, what an operator is required to do is up to the point just described. Namely, the operator is not required to do any complicate or troublesome job, for example, to set the tape of the fresh reel along a predetermined supply route.

In this instance, a lengthy front leader tape portion 1b is attached to the fore end of an electronic parts carrier portion 1a of the tape 1 which is wound on the supply reel 14B. In case a fore end portion of this front leader tape portion 1b is set and retained on the tape holder member 41L, it becomes necessary to carry forward the tape 1 over a relatively long distance corresponding to the length of the leader tape portion 1b before starting a punching operation on the fresh tape 1. In order to shorten the carry-forward distance, a major portion of the leader tape portion 1b may be cut off the fresh tape 1 from the supply reel 14B, and set the fresh tape 1 on the tape holder 41L at a position close to its electronic parts carrier portion 1a. This makes it possible to switch the tape punching operation to the fresh tape very quickly as soon as the current tape is consumed completely.

Thus, the operator is allowed to set a fresh supply reel 14B at an arbitrary time point irrespective of the progress of the electronic parts punching operation at the tape punching station 12 and quickly within a shortened period of time to improve the working efficiency to a marked degree. The tape 1 is fed to the tape punching station 12 continuously from the supply reel 14A while and after the fresh supply reel 14B is being set at the feeding station 11 to stand by there. The supply of the tape 1 to the tape punching station 12 is constantly watched by the sensor 30. The sensor 30 is adapted to detect the electronic circuitry part 2a in each electronic part section 2 or other features or characteristics of the tape 1. When no electronic part section 2 is detected by the sensor 30 on the tape 1 from the supply reel 14A, that is to say, upon detecting that all of the electronic part carrier portion 1a of the tape 1 from the reel 14A has passed through the tape punching station 12, a tape end signal is fed to the tape switcher 20 thereby to switch the tape supply from the reel 14A to the reel 14B. Thus, in this instance, the sensor 30 serves as a tape end detection means.

Figure 7:
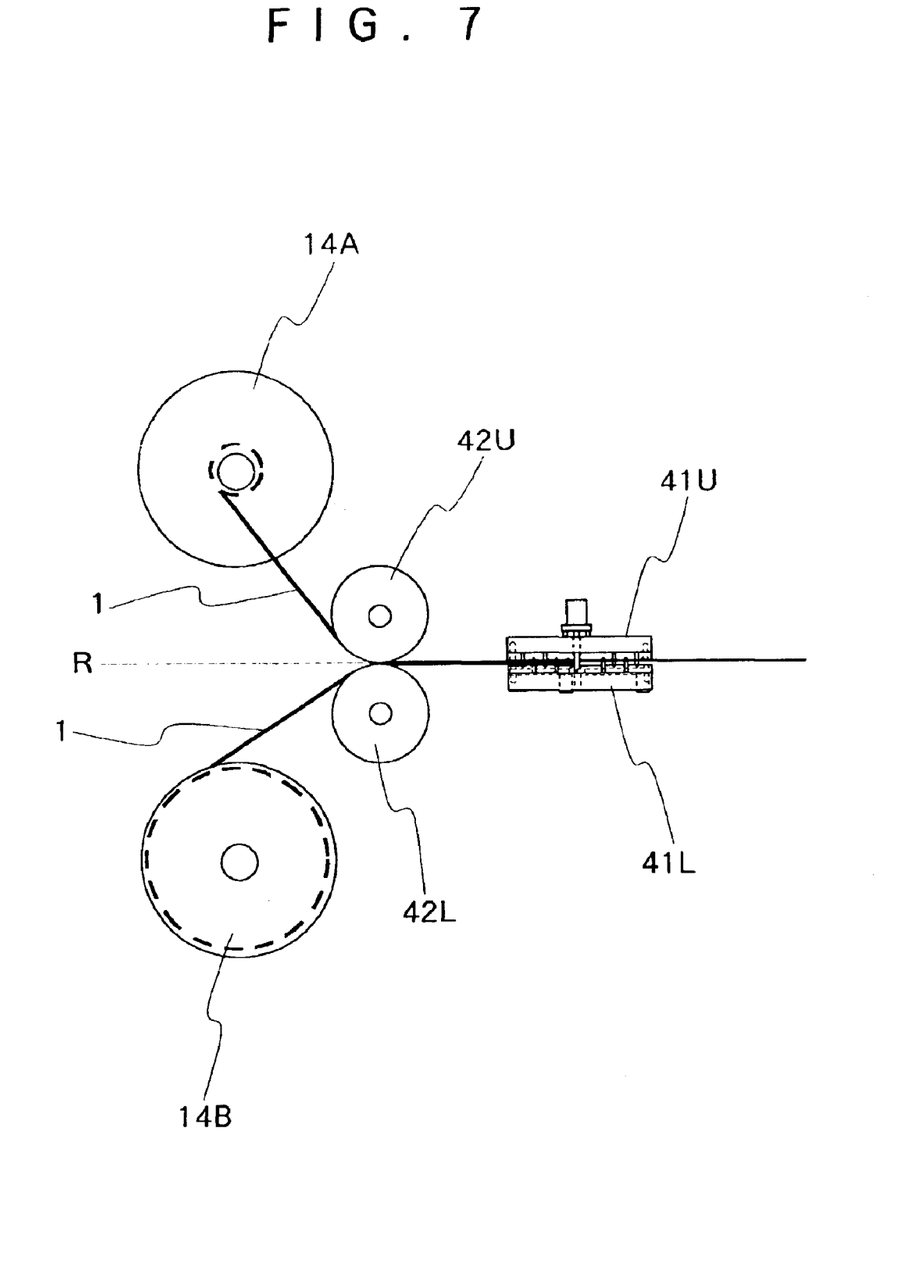
FIG. 7 is a schematic illustration showing an operation of cutting the consumed tape.

In the tape switching operation, firstly the upper tape holder member 41U is moved downward and the lower tape holder member 41L is moved upward to join the upper and lower tape holder members 41U and 41L together on the tape supply route R as shown in FIG. 7. Simultaneously, the roller 42L is moved upward in step with the upward movement of the lower tape holder member 41L. At this time, since the tape 1 from the supply reel 14A, which is now in use, runs along the tape supply route R, the positioning pins 44 of the upper and lower tape holder members 41U and 41L are brought into engagement with sprocket holes 4 in that tape 1. In some cases, there may be a certain degree of misalignment between the positioning pins 44 and the sprocket holes 4 in the tape 1 currently in use. However, since the positioning pins 44 are sharp-pointed form at their distal ends to ensure ready intrusion into sprocket holes 4 despite some positional deviation, the position of the tape 1 is adjusted by engagement with the positioning pins 44. In case the positioning pins 44 are completely deviated from the sprocket holes 4, the position of the tape 1 is adjusted by turning the tape driving sprockets 23 and 24 to a suitable degree.

As the fore end of the fresh tape 1 in the standby position is held in engagement with the positioning pins 44 on the back zone B of the tape holder member 41L, the sprocket holes 4 in the fresh tape 1 and the sprocket holes 4 in the consumed tape 1 are superposed in an aligned state. In this state, the cutter 45 is actuated to cut the consumed tape 1. At this time, the standing-by fresh tape 1 is not cut by the cutter 45 because it is set only on the back zone B on the rear side of the cutter 45. Of course, no problem will arise even if a fore end portion of the fresh tape 1 which happens to run beyond the back zone B is cut off by the cutter 45 along with the consumed tape 1.

Upon cutting the consumed tape 1, the rear end of the cut tape is retained on the zone F of the tape holder member 41U by the gripping force of the suction holes 43U. On the other hand, the rear part of the cut tape 1 on the side of the supply reel 14A is still engaged with the positioning pins 44 on the tape holder member 41U. If desired, this rear part of the tape 1 may be forcibly disengaged from the positioning pins 44 and rewound onto the supply reel 14A. However, this rear portion of the cut tape 1 may be retained on the tape holder member 41U until a fresh supply reel is set in position.

Figure 8:
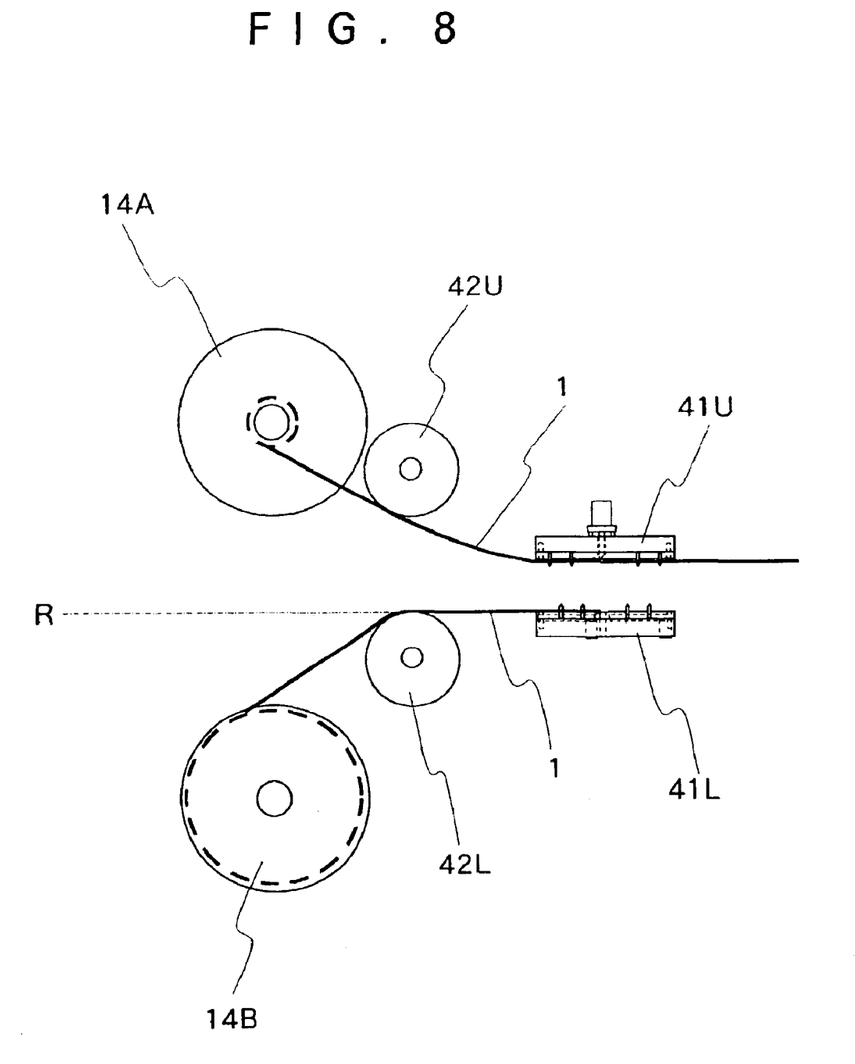
FIG. 8 is a schematic illustration showing a first stage of an operation of overlapping a cut end of the consumed tape on a fore end portion of a fresh tape in a standby position.
Figure 9:
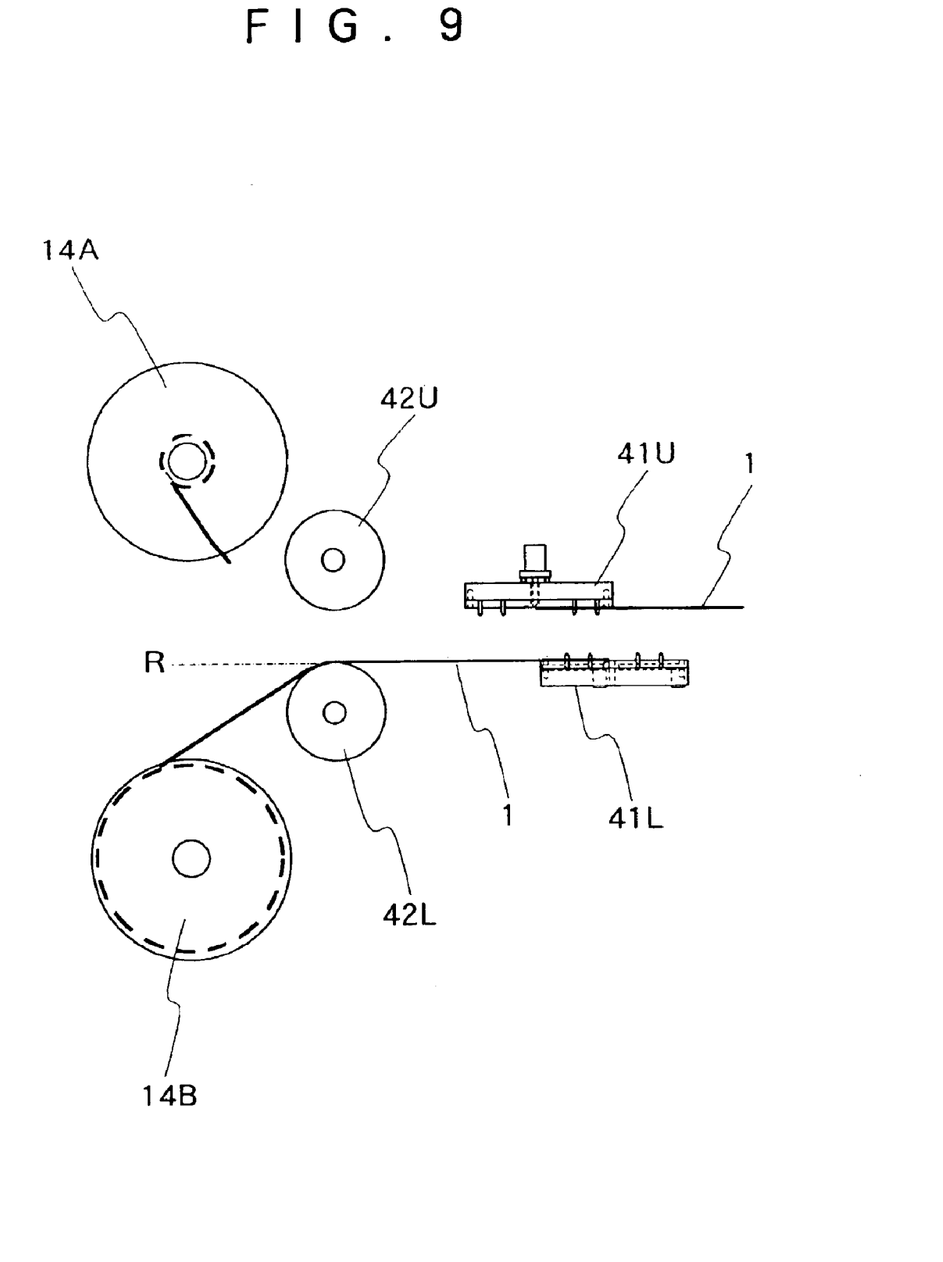
FIG. 9 is a schematic illustration showing a second stage of the operation of overlapping the cut end of the consumed tape on the fore end portion of the fresh tape in the standby position.
Figure 10:
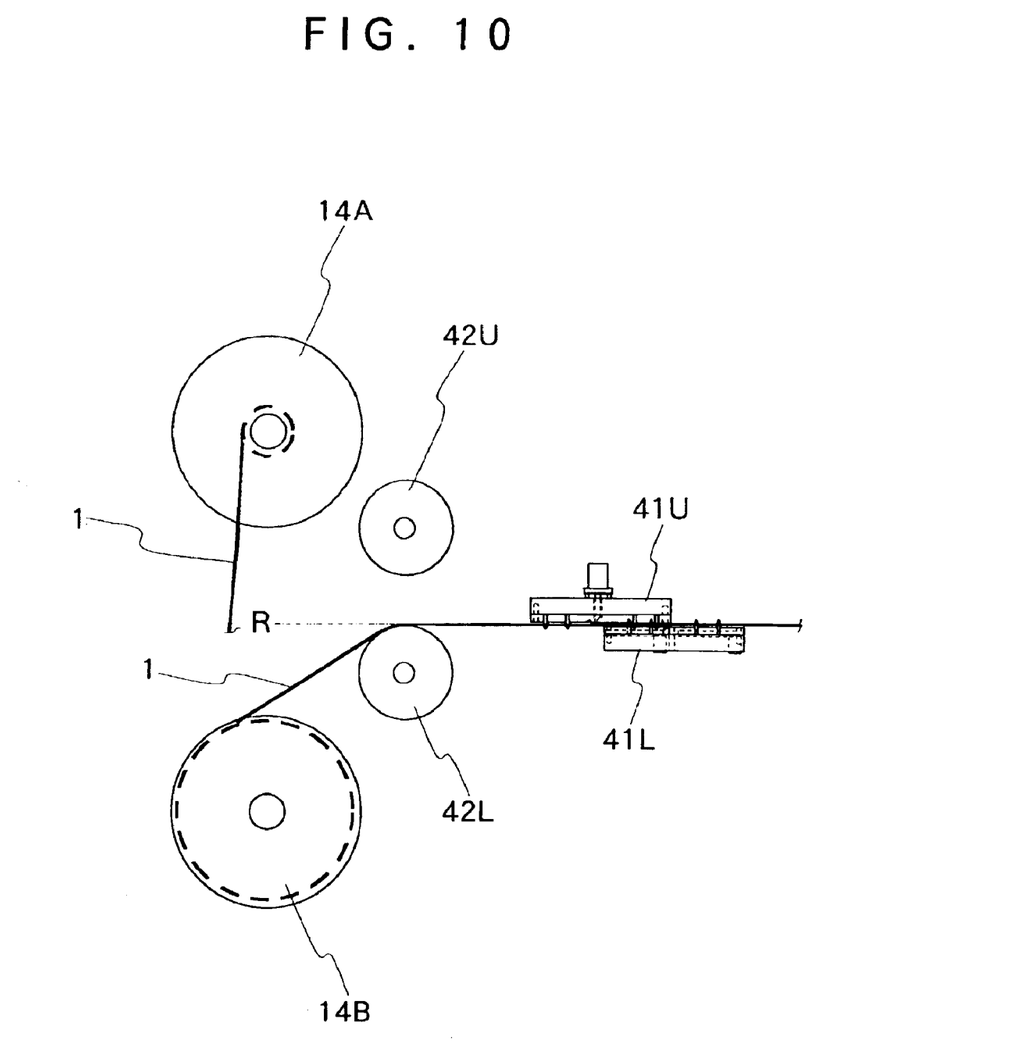
FIG. 10 is a schematic illustration showing the tape from the fresh supply reel being spliced to a rear end portion of the consumed tape.

In the next place, the tape holder member 41U is moved in a direction away from the tape supply route R to take a receded position as shown in FIG. 8. Then, the position of the lower tape holder member 41L is shifted forward to bring the back zone B of the tape holder member 41L into a confronting position relative to the front zone F of the upper tape holder member 41U as shown in FIG. 9. Thereafter, the tape holder member 41U is lowered to overlap the rear end of the consumed tape 1 on a fore end portion of the fresh tape 1 from the supply reel 14B. In this state, the stapler 46B is actuated to connect the overlapped portions of the consumed and fresh tapes 1. After connecting the tapes 1, as shown in FIG. 10, the roller 42L is advanced to the operative position at the tape supply route R and the upper and lower tape holder members 41U and 41L are moved away from the tape supply route R into respective receded positions. As a consequence, the tape supply is switched from the reel 14A to the reel 14B, that is to say, now the tape 1 is fed to the tape punching station 12 from the fresh supply reel 14B. The tape 1 is fed forward at a high speed as far as the sensor 30, and, according to a detection signal from the sensor 30, a punching operation on the fresh tape 1 from the supply reel 14B is started at the tape punching station 12, successively punching out the electronic parts sections 2 on the carrier portion 1a of the tape 1.

In this manner, the machine starts to punch the tape 1 from the fresh supply reel 14A, which is a reel currently in use. Now, the consumed supply reel 14A can be removed from the reel support shaft 15, and another fresh supply reel 14A can be set thereon as a standby reel. It follows that a fresh standby reel can be set on the reel support shaft at any time point which is convenient to the operator. The collecting boxes 16 and 17 are emptied from time to time when they are filled with a large amount of punched tapes or used separator tapes. The fore end of the tape 1 from the supply reel 14A, which is now set as a standby reel, is engaged with positioning pins 44 in the back zone B of the upper tape holder member 14U. Further, at the time of the tape splicing operation, the upper tape holder member 14U is shifted in the forward direction to a position where a fore end portion of the tape 1 from the standby reel 14A is overlapped on a rear end portion of the tape 1 from the reel 14B, which is now a consumed reel.

What is claimed is:

1. A machine for punching out assembled electronic circuitry parts from a carrier tape with sprocket holes in a predetermined pitch along sight and left side edges thereof, including a tape feeding station arranged to reel off an electronic parts carrier tape having a plural number of assembled electronic part sections at predetermined intervals in the longitudinal direction thereof, and a tape punching station arranged to punch out said electronic part sections successively from said carrier tape, characterized in that said machine comprises:

at least a pair of reel support shafts provided separately at said tape feeding station to reel off a carrier tape from a second supply reel to continue tape feed as soon as a carrier tape from a first supply reel is consumed to a last electronic part section; and a tape switcher located in the course of a tape supply route between said tape feeding station and said tape punching station, and provided with upper and lower tape holder members movable toward and away from each other across said tape supply route and back and forth in the direction of tape supply, said upper and lower tape holder members being adapted to releasably hold said first and second carrier tapes from opposite sides in an overlapped state and over a length corresponding to two units lengths of said electronic parts section on said carrier tapes, active and passive cutter blades provided in confronting positions on said upper and lower tape holder members to cut said first carrier tape at a longitudinally intermediate position, and splicing means adapted to splice a head end portion of said second carrier tape to a tail end portion of said first carrier tape in an overlapped state.

2. A machine as defined in claim 1, further comprising a pair of guide rollers adapted to guide a carrier tape from one of said first and second supply reels to said tape supply route and to locate a fore end portion of a carrier tape from the other one of said first and second reels at a standby position spaced from said tape supply route.

3. A machine as defined in claim 1, wherein said upper and lower tape holder members are each provided with positioning pins to be disengageably engaged in said sprocket holes, and suction holes for gripping said carrier tape at longitudinally spaced positions.

4. A machine as defined in claim 1, wherein a leader tape portion void of electronic parts sections is attached to head and tail ends of each carrier tape on said first and second supply reels.

5. A machine as defined in claim 1, comprising a tape end sensor provided in the course of a tape supply route between said tape feeding station and said tape punching station to detect a position of a last electronic part section on said first carrier tape, and adapted to produce an end detection signal to put said upper and lower tape holder members in a tape splicing operation.

6. A machine as defined in claim 1, wherein said upper and lower tape holder members are adapted to splice a head end portion of said second carrier tape to a tail end portion of said first carrier tape.

7. A method for replacing tape supply reels in feeding a carrier tape having sprocket holes with predetermined pitch along right and left side edges thereof and carrying a plural number of assembled electronic part sections at predetermined intervals in the longitudinal direction thereof, from a tape feeding station toward a tape punching station arranged to punch out said electronic part sections successively from said carrier tape, said method comprising the steps of:

providing and setting at least a pair of carrier tape supply rears at said tape feeding station to feed a carrier tape to said punching station firstly from a first supply reel and then from a second supply reel continuously in an uninterrupted manner;

providing tape holder members in the course of a tape supply route between said tape feeding station end said tape punching station, movable toward and away from each other across said tape supply route and back and forth in the direction of tape supply;

while a first carrier tape from said first supply reel is being fed to said punching section, letting one of said holder members grip a fore end portion of a second carrier tape from said second supply reel on a rear holder section having a length corresponding to one unit length of one of said electronic part sections;

letting the other tape holder member grip a tail end portion of said first carrier tape on front and rear holder sections as soon as a last electronic part section on said first carrier tape is punched out;

closing said tape holder members, one on the other, from opposite sides of said first and second carrier tapes, and cutting said first carrier tape at an intermediate position between said front and rear holder sections; and advancing said second carrier tape by a distance corresponding to said one unit length of said electronic pert sections, and splicing a head end portion of said second carrier tape to a tail end portion of said first carrier tape in an overlapped state.

8. A method of continuously punching out electronic circuitry parts from carrier tapes each carrying assembled electronic circuitry parts at predetermined intervals in the longitudinal direction thereof said method comprising the steps of:

providing and setting at least a pair of carrier tape supply reels at said tape feeding station to teed a carrier tape to said punching station firstly from a first supply reel and then from a second supply reel continuously in an uninterrupted manner;

providing tape holder members in the course of a tape supply route between said tape feeding station and said tape punching station, movably toward and away from each other across said tape supply route and back and forth in the direction of tape supply;

while a first carrier tape from said first supply reel is being fed to said punching section, letting one of said holder member grip a fore end portion of a second carrier tape from said second supply reel on a rear holder section having a length corresponding to one unit length of one of said electronic part section;

letting the other tape holder member grip a tail end portion of said first carrier tape on front and rear holder section s as soon as a last electronic part section on said first carrier tape is punched out;

closing said tape holder members, one on the other, from opposite side of said first and second carrier tapes, and cutting said first carrier tape at an intermediate position between said front and rear holder sections; and advancing said second carrier tape by a distance corresponding to said one unit length of said electronic part sections, and splicing a head end portion of said second carrier tape to a tail end portion of said first carrier tape in an overlapped state to continue tape feed to aid tape punching station.

* * * * *